(12) United States Patent
Kendall et al.

(10) Patent No.: US 6,639,219 B2
(45) Date of Patent: Oct. 28, 2003

(54) ELECTRON SCATTER IN A THIN MEMBRANE TO ELIMINATE DETECTOR SATURATION

(75) Inventors: Rodney A. Kendall, Ridgefield, CT (US); Christopher F. Robinson, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 10/045,445

(22) Filed: Nov. 9, 2001

(65) Prior Publication Data

US 2003/0089853 A1 May 15, 2003

(51) Int. Cl.⁷ .............................................. G01N 23/00
(52) U.S. Cl. ..................... 250/311; 250/491.1
(58) Field of Search .............. 250/491.1, 310, 250/397, 492.2, 311

(56) References Cited

U.S. PATENT DOCUMENTS 4,513,203 A * 4/1985 Bohlen et al. ........... 250/491.1
5,703,373 A * 12/1997 Peckerar et al. ......... 250/491.1

* cited by examiner

Primary Examiner—John R. Lee
Assistant Examiner—Johnnie L. Smith, II
(74) Attorney, Agent, or Firm—Jay H. Anderson

(57) ABSTRACT

An electron beam system employs a non-saturating detector for measuring total beam current that comprises a thin membrane of only a few microns thickness placed before a detector and separated from the detector by a drift space of about 10 mm, so that electrons in the beam are not absorbed to any significant extent, but are scattered transversely to spread the beam and avoid local saturation of the detector.

8 Claims, 2 Drawing Sheets

ELECTRON SCATTER IN A THIN MEMBRANE TO ELIMINATE DETECTOR SATURATION

FIELD OF THE INVENTION

The field of the invention is electron beam systems, in particular, systems for electron beam lithography.

BACKGROUND OF THE INVENTION

In the field of particle beam systems, such as those used for lithography, it is necessary to measure the total current in the beam. High gain (efficient) electron detectors developed for microscopy applications are prone to local saturation (meaning that the relation of output signal to input current changes significantly) when directly impacted by the beam of a lithography system. The high gain possible with scintillator/photomultiplier tube, diode/pre-Amp and microchannel plate detectors is necessary to obtain optimal signal to noise ratios in lithography systems because the total beam current is relatively low at 0.1–1.0 $\mu$A.

In situations where the beam is dispersed, these detectors have performed very well. All three of the detector types listed have been successfully employed as backscatter detectors. When the electron beam in a lithography tool is focused, or nearly focused however, the current density can be as high as 100 A/cm2. Even though the total current is low, the concentrated nature of the beam can lead to local saturation effects in the detector.

Once the detecting medium has saturated, additional beam current produces no more light (scintillator), electron-hole pairs (diode) or photoelectrons (microchannel plate) and additional current in the beam will not produce any increase in the current output from the detector. This reduces the useful operating range of the detector in critical applications like knife edge beam blur measurements, where the output current of the detector must be proportional to the input current in order to preserve data integrity. For this reason lower gain detectors (e.g. unity gain Faraday cups) are often used as transmission detectors on e-beam lithography tools.

The most common alternative solution is to use a low gain detector with supplemental amplification, but the signal to noise characteristics of such an arrangement are inferior to those obtained with a higher gain detector that requires less subsequent amplification. Others have also attacked this problem by locating the detector far from the target image plane. However, in order to achieve a reasonable degree of defocusing a few hundred millimeters of separation is required for a typical beam with a semi-angle on the order of 10 mRAD. This much separation is generally not available and would place unreasonable constraints on the system mechanical designers.

In summary, the art has sought a compact system for measuring low total beam current in beams having a high current density.

SUMMARY OF THE INVENTION

The subject invention relates to the use of a high gain transmission detector located behind a diffusing member that spreads the electron beam current over the surface of the detector. A feature of the invention is the use of a thin diffusing member that absorbs only a small fraction of the incident beam.

Another feature of the invention is the use of a small drift distance between the diffusion member and the detector, so that the detection system can fit in a confined space.

Another feature of the invention is that the diffusing member functions as a pellicle, protecting the detector from particulate contamination and deposition of cracked hydrocarbons from the ambient that would build up and require detector replacement.

DESCRIPTION OF THE PREFERRED EMBODIMENT

Figure 1:
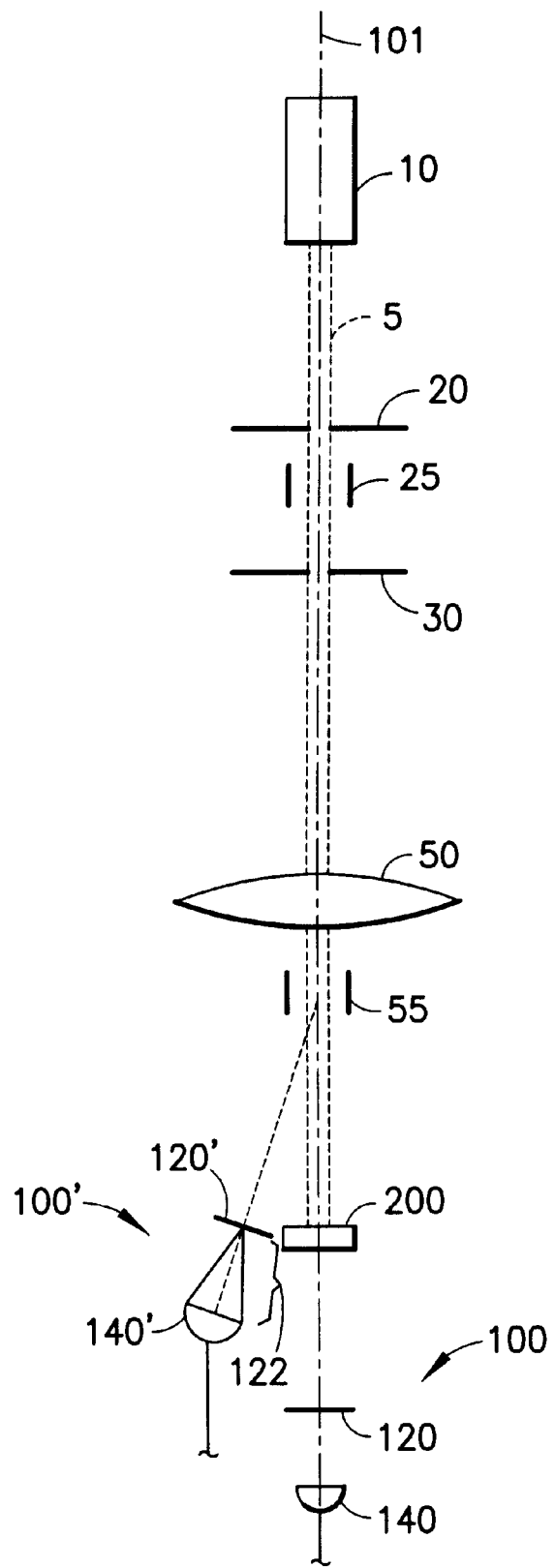
FIG. 1 shows, in partially pictorial, partially schematic form, a system employing the subject invention.

Referring now to FIG. 1, a simplified drawing of a shaped-beam lithography system comprises a source 10 for generating an electron beam 5 and directing it along axis 101 toward first shaping aperture 20, which forms a beam with a square cross section. Deflectors 25 move beam 5 in two orthogonal transverse directions with respect to second shaping aperture 30 to form a rectangle of the desired shape. The invention applies as well to Gaussian (probe-forming) systems that generate a beam covering only a single pixel and electron projection lithography systems that project an image from a reticle to the workpiece.

Lens 50 forms an image of aperture 30 on workpiece 200. Deflectors 55 move the rectangular beam around on the workpiece within a deflection range to stitch together a number of such rectangles to form the pattern. Workpiece 200, which may be a semiconductor wafer, lithography mask substrate, a reticle for a projection lithography system, a portion of a hard disk drive head substrate, or other workpiece being micromachined, will be generally mounted on a mechanical stage to cover a broader area than can be covered by deflectors 55.

Typically, a deflector assembly would be located along the beam axis 101 beneath workpiece 200 and associated translation stage. Alternatively, deflectors 55 or supplementary deflectors could deflect beam 5 away from the workpiece to strike beam detector assembly 100. It is an advantageous feature of the invention that it does not matter if the distortion in the beam increases for such a large deflection, because only the total beam current is of interest.

Within detector 100, a thin, reasonably conductive membrane 120 is placed a relatively short drift distance 122 in front of the surface of detector 140. Illustratively, membrane 120 is formed from boron-doped silicon and has a thickness in the area through which the beam passes of about 2 $\mu$m. Membrane 120 may be formed by implanting a standard silicon wafer of thickness about 625 $\mu$m on one side with a dopant that resists etching, then etching the wafer from the other side. A cross section of a membrane is shown in FIG. 2.

Figure 2:
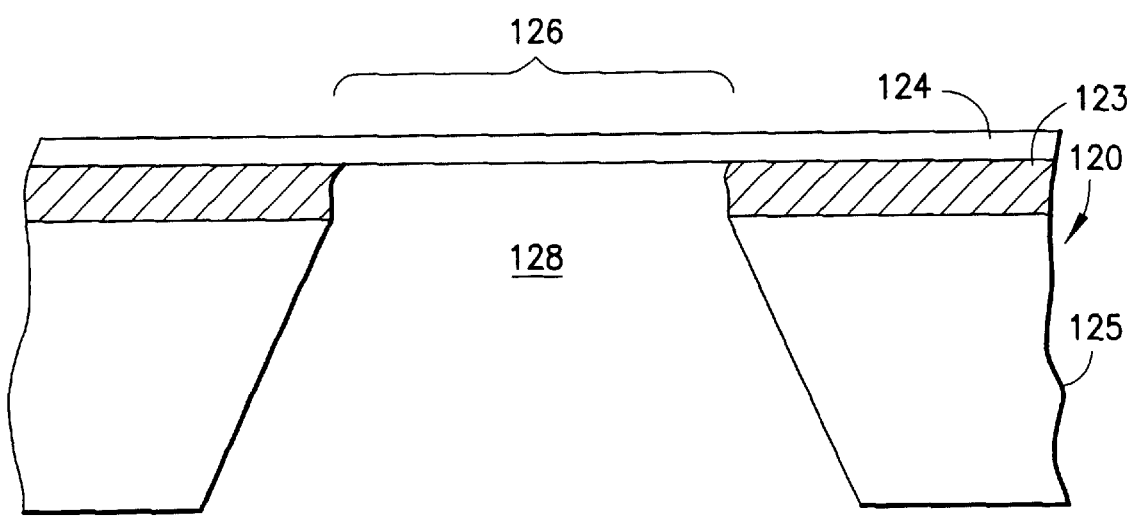
FIG. 2 shows a cross section of a diffusing membrane used with the invention.

In FIG. 2, a cross section of membrane substrate 120 shows an SOI wafer having a buried oxygen-doped layer 123 formed in substrate 125. Layer 123 is illustratively formed by oxygen implantation in a SIMOX (Separation by Implantation of OXygen) process. Since the wafer need not support transistors, the annealing steps that are required in a conventional SIMOX process to produce a wafer qualified for integrated circuit production may be eliminated. Above layer 125, layer 124 is illustratively doped with Boron to a concentration of 1×1018 cm3. An ohmic level of doping is not required—only that the top layer have enough conductivity that it will not trap charge. An aperture 128 has been etched from the back in a wet etch using standard KOH chemistry, to etch the bulk silicon wafer and stop on the SIMOX layer. Optionally, the SIMOX layer has been etched using wet etching with HF chemistry in a region denoted with bracket 126, to expose a region of doped layer 124 big enough to accept the beam (illustratively about 1 μm in diameter) even if it has been deflected off axis by up to a millimeter.

Since the area of the thin membrane of layer 124 is only about 5 mm square, strength of the membrane is not an issue.

The thickness of membrane 120 is chosen so that a relatively minor portion (meaning less than about 10%) of beam 5 is absorbed, both to give a more accurate reading of beam current and to reduce the heat load on the membrane. With the illustrative thickness of 2 μm, a 50 keV beam will have approximately 5% of its electrons absorbed in the membrane.

The electrons that pass through membrane 120 will be scattered, so that the local intensity in the beam is reduced. It has been found that for a detector system comprising a YAG crystal of thickness 1 mm and a photomultiplier tube (Thorn EMI, 9794B) a total beam current of 0.8 μA is spread over a diameter of 12 mm at a drift distance denoted by bracket 122 of 10 mm.

In an experiment, the scintillator output saturated at approximately 0.5 μA of electron beam current when no diffusing membrane was used. When the silicon membrane was approximately 40 mm above the surface of the YAG scintillator, the spread beam overfilled the 20 mm diameter crystal, charging up the exposed surface of the leaded glass vacuum window beneath the scintillator. When the drift distance was reduced to 10 mm, the beam spread out over the surface of the scintillator crystal filling approximately 50% of the surface area. With this arrangement currents in excess of 4.0 μA have been detected without saturation.

While the invention has been described in terms of a single preferred embodiment, those skilled in the art will recognize that the invention can be practiced in various versions within the spirit and scope of the following claims.

We claim:

1. An electron beam system comprising:
   an electron source for generating an electron beam containing a beam current; and
   means for directing said electron beam on to a workpiece;
   further comprising:
      a diffusing member for scattering said beam transversely;
      detector means disposed behind said diffusing member, for detecting said electron beam current and producing a signal in response thereto; in which
         said diffusing member has a scattering thickness such that a minor portion of said beam is absorbed therein;
         said detector means is displaced from said diffusing member by a drift distance such that said electron beam spreads sufficiently that said detector means does not saturate.

2. A system according to claim 1, further including deflection means for deflecting said beam from a nominal beam direction toward said diffusing member.

3. A system according to claim 1, in which said diffusing member comprises doped silicon having a thickness of about 2 μm.

4. A system according to claim 2, in which said diffusing member comprises doped silicon having a thickness of about 2 μm.

5. A system according to claim 1, in which less than about 5% of said electron beam is absorbed in said diffusing member.

6. A system according to claim 2, in which less than about 5% of said electron beam is absorbed in said diffusing member.

7. A system according to claim 1, in which said detector comprises a scintillator disposed before a photomultiplier tube.

8. A system according to claim 2, in which said detector comprises a scintillator disposed before a photomultiplier tube.

* * * * *